United States Patent [19]

Kunda et al.

[11] Patent Number: 5,675,728
[45] Date of Patent: Oct. 7, 1997

[54] APPARATUS AND METHOD IDENTIFYING FALSE TIMING PATHS IN DIGITAL CIRCUITS

[75] Inventors: Ramachandra P. Kunda, Milpitas; Saied Bozorgui-Nesbat, Belmont; Hong Hao, Sunnyvale, all of Calif.

[73] Assignee: Sun Microsystems, Inc., Mountain View, Calif.

[21] Appl. No.: 679,318

[22] Filed: Jul. 12, 1996

Related U.S. Application Data

[63] Continuation of Ser. No. 594,483, Jan. 31, 1996, abandoned, which is a continuation of Ser. No. 287,965, Aug. 9, 1994, abandoned.

[51] Int. Cl.$^6$ .................................................. G01R 31/28
[52] U.S. Cl. .................... 395/183.04; 395/183.09; 371/27; 364/578
[58] Field of Search .................. 395/183.01, 183.04, 395/183.06, 183.09; 371/67.1, 22.5, 22.1, 22.6, 25.1, 29.1, 27; 364/488, 489, 569, 578; 326/21, 93, 113; 327/26, 292, 551, 261, 276

[56] References Cited

U.S. PATENT DOCUMENTS

| | | | |
|---|---|---|---|
| 4,556,840 | 12/1985 | Russell | 324/73 R |
| 4,852,093 | 7/1989 | Koeppe | 371/23 |
| 4,924,430 | 5/1990 | Zasio et al. | 364/578 |
| 5,023,485 | 6/1991 | Sweeney | 307/465 |
| 5,095,454 | 3/1992 | Huang | 364/578 |
| 5,138,579 | 8/1992 | Tatsumi et al. | 365/203 |
| 5,191,541 | 3/1993 | Landman et al. | 364/489 |
| 5,200,907 | 4/1993 | Tran | 364/490 |
| 5,319,646 | 6/1994 | Simpson et al. | 371/22.3 |
| 5,377,197 | 12/1994 | Patel et al. | 371/23 |
| 5,387,825 | 2/1995 | Cantrell et al. | 326/26 |
| 5,448,497 | 9/1995 | Ashar et al. | 364/489 |
| 5,452,239 | 9/1995 | Dai et al. | 364/578 |

FOREIGN PATENT DOCUMENTS

| | | | |
|---|---|---|---|
| 0 229 975 | 12/1986 | European Pat. Off. | G06F 15/60 |
| 0 600 608 | 10/1993 | European Pat. Off. | G06F 15/60 |

OTHER PUBLICATIONS

Proceedings of the IEEE/ACM International Conference on Computer Aided Design (ICCAD), Santa Clara, Nov. 8–12, 1992, no. Conf. 10, Institute of Electrical and electronics engineers, pp. 258–262.

Proceedings of the IEEE/ACM International Conference on Computer Aided Design (ICCAD), Santa Clara, Nov. 8–12, 1992, no. Conf. 10, 8 Nov. 1992, Institute of Electrical Electronics Engineers, p. 510–517.

Proceedings of the ACM/IEEE Design Automation Conference, San Francisco, Jun. 17–21, 1991, no. Conf. 28, 17 Jun. 1991 Institute of Electrical and Electronics Engineers, pp. 551–554.

*Primary Examiner*—Robert W. Beausoliel, Jr.
*Assistant Examiner*—Albert Décady
*Attorney, Agent, or Firm*—Blakely Sokoloff Taylor & Zafman

[57] ABSTRACT

A method for identifying false paths in a digital circuit. A list of paths corresponding to the digital circuit is either provided or generated. For each path, an AND gate is created. For each element in the path, the off-path signals of the monitor circuits corresponding to the elements of the path are coupled to the input of the AND gate. A plurality of different signals are input to the digital circuit in an attempt to generate a "1" at the output of the AND gate. A false timing path signal is generated for that path if the AND gate does not output a "1" within a pre-determined amount of time. This process is repeated for each path of the digital circuit to identify all false timing paths.

9 Claims, 13 Drawing Sheets

APPARATUS AND METHOD IDENTIFYING FALSE TIMING PATHS IN DIGITAL CIRCUITS

This is a continuation of application Ser. No. 08/594,483 filed Jan. 31, 1996, now abandoned which is a continuation of application Ser. No 08/287,965 filed Aug. 9, 1994, now abandoned.

FIELD OF THE INVENTION

The present invention pertains to the field of digital circuit design, layout, and optimization. More particularly, the present invention relates to an apparatus and method for identifying false timing paths in digital circuits.

BACKGROUND OF THE INVENTION

Computers are being used in computer aided design and computer aided-manufacturing (CADCAM) applications as a tool for engineers and designers. One application for which computers have been utilized is in the design, layout, and optimization process for digital circuits. Before an integrated circuit (IC) is actually fabricated, its circuit design can be simulated on a computer and tested. Errors in the design can be identified and corrected without actually fabricating and testing the chip. This minimizes development cost and speeds up time to market. Furthermore, computers are being used to optimize IC layout in order to reduce the die size. Reducing the die size is important because a smaller die size means that more dies (i.e., chips) can be fabricated from a given wafer. This directly translates into less manufacturing cost per die.

Prior art IC test tools currently have the capability of identifying the false timing paths. A false timing path is defined as a timing path which is never exercised logically. In other words, no matter what combination of signals are input to the IC, the false timing path is never implemented. The reason why identifying false timing paths is important because once these false timing paths are known, they do not have to be optimized. Sometimes, circuit designs can have hundreds of false timing paths. Not having to optimize all of these false timing paths reduces design effort, and shortens design cycles.

In the prior art, vectors were used in an effort to identify false timing paths. For example, in the design of an adder which adds two digital numbers together, the engineer or designer can introduce groups of numbers (e.g., vectors) to be added together in order to test the circuit layout. The problem with using a vectors approach is that the engineer or designer initially has to identify the specific vectors to be applied to a particular circuit design. This can be a time-consuming and tedious job. Furthermore, unless one uses an exhaustive number of vectors, it is virtually impossible to test for every potential case. In addition, some elements of a circuit might be shared among several different paths which increases the complexity of the testing procedure.

Moreover, ICs are becoming more complex. For example, application specific IC's (ASIC's) and gate arrays can contain thousands of gates. Indeed, modern microprocessors have millions of transistors. The trend is towards even more complex logic and higher density IC's. In an effort to keep up with these advances, faster and more powerful computers are being developed. Moreover, the application programs for circuit designs are becoming more sophisticated. Even with the aid of computers, it is becoming quite a complicated and involved task to design, layout, optimize, and test an IC. The trend is towards expending increasing amounts of time, resources, and money for testing new semiconductor designs.

Thus, there is a need in the prior art for a dependable and efficient mechanism for identifying false timing paths in digital circuits in order to minimize the task of testing a new semiconductor design. Preferably such a mechanism should require minimal human interaction for its operation.

SUMMARY OF THE INVENTION

The present invention is directed to an apparatus and method for identifying false timing paths in a digital circuit. Initially, a list of paths corresponding to the digital circuit is generated. For each path of the digital circuit, an AND function is created. For each element in the path, the off-path signals of the circuit corresponding to the elements of the path are coupled to the input of the AND function. A plurality of different signals are input to the digital circuit in an attempt to generate a "1" at the output of the AND function. If the AND function cannot output a "1" for any possible input combination of the circuit, the path is identified as a false timing path. This process is repeated for each path of the digital circuit in order to identify all false timing paths.

In one embodiment, a user inputs a netlist, path information, and a library table into a computer system in order to identify the false paths for the various modules of a new semiconductor chip design. The netlist specifies the electrical characteristics of the various modules. This netlist is modified by adding AND-gate circuitry in order to validate each of the paths associated with a particular module. This modified netlist is referred to as a monitor circuit. The path information defines the interconnections between the electrical elements of a monitor circuit. The library table contains the information required to interface the AND-gates for each path of the monitor circuit. Thus, for each module, there exists paths from each input to each output of that module.

Test signals are then applied to this monitor circuit. If one of the test signals can propagate along one of the paths, that particular path is designated as being active. This process is repeated for each of the paths of the monitor circuit. By implementing a Boolean function for each of the monitor circuit's inputs, it is determined whether or not a path has been activated. The output of the monitor circuit is a "1" if the path is activated and "0" otherwise. If, after a predetermined number of different test signals fail to activate a particular path of the monitor circuit, that path is designated as being a false timing path. Once all of the false timing paths have been identified, the new design can be optimized more efficiently by disregarding false timing paths that were identified.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

An apparatus and method for identifying false timing paths is described. In the following description, for purposes of explanation, numerous specific details are set forth, such as gates, subroutines, netlists, etc., in order to provide a thorough understanding of the present invention. It will be obvious, however, to one skilled in the art that the present invention may be practiced without these specific details. In other instances, well-known structures and devices are shown only in block diagram form to avoid unnecessary details obscuring the present invention.

Figure 1:
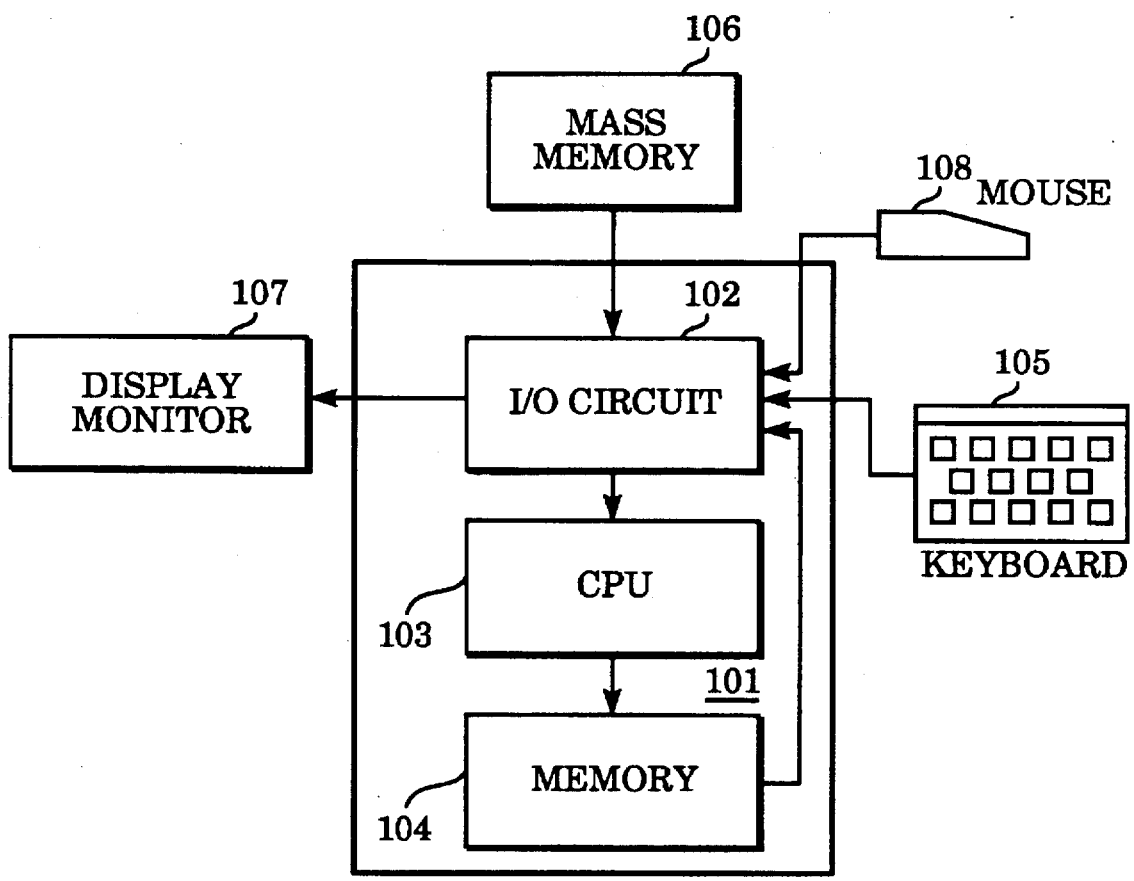
FIG. 1 shows a typical computer system used for identifying false timing paths according to the present invention.

FIG. 1 shows a typical computer-based system for identifying false timing paths according to the present invention. Shown is a computer 101 which comprises three major components, including input/output (I/O) circuit 102, the central processing unit (CPU) 103 and memory 104. These latter two elements are found in most general purpose computers and almost all special purpose computers. In fact, the several elements contained within computer 101 are intended to be representative of this broad category of data processors. Particular examples of suitable data processors to fill the role of computer 101 include machines manufactured by Sun Microsystems, Inc., Mountain View, Calif. Other computers having like capabilities may of course be adapted in a straightforward manner to perform the functions described below.

Also shown in FIG. 1 is an input device 105, shown in typical embodiment as a keyboard. It should be understood, however, that the input device may actually be a card reader, magnetic or paper tape reader, or other well-known input device (including, of course, another computer). A mass memory device 106 is coupled to the I/O circuit 102 and provides additional storage capability for the computer 101. The mass memory may include other programs and the like and may take the form of a magnetic or paper tape reader or other well-known device. It will be appreciated that the data retained within mass memory 106, may, in appropriate cases, be incorporated in standard fashion into computer 101 as part of memory 104.

In addition, a display monitor 107 is illustrated which is used to display messages or other communications to the user. Such a display monitor may take the form of any of several well-known varieties of CRT displays. A cursor control 108 is used to select command modes and edit the input data, and in general provides a more convenient means to input information into the system.

Figure 2:
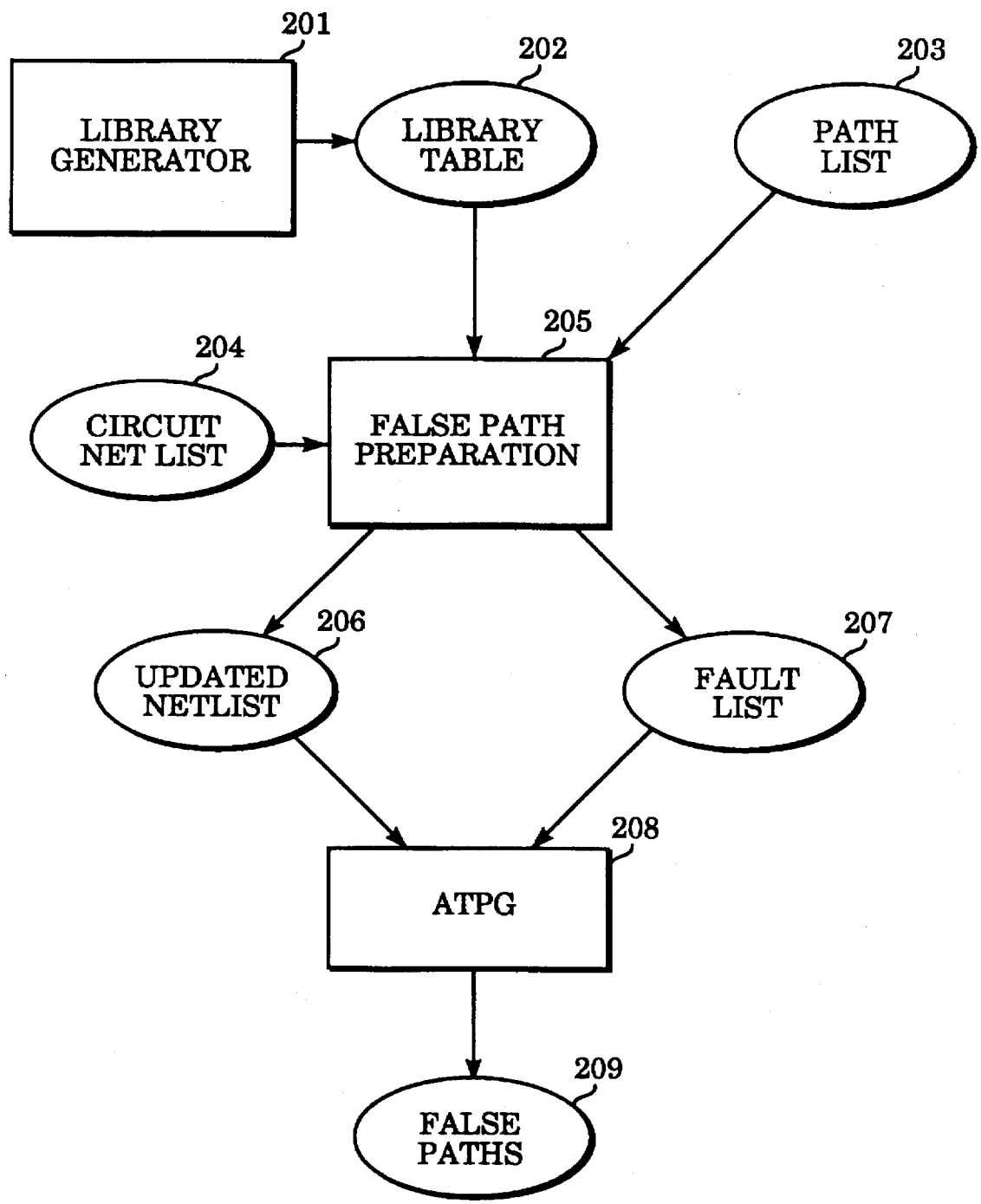
FIG. 2 shows the flow for the false path identification process of the present invention.

FIG. 2 shows the flow for the false path identification process of the present invention. A library generator 201 is used to create a library table 202 which is input to the false timing path preparation block 205. The contents of library table 202 are the netlist to be augmented to the original netlist to aid in finding false timing paths. The augmented netlist is called monitor circuit. For each module in the library table 202, there are paths from each input to each of the outputs. A transition can propagate along a path if and only if certain conditions are met. If a transition can propagate along a path, that path is designated as being activated. The monitor circuit, which implements a boolean function of the module inputs, indicates whether a path has been activated or not. The output of the monitor circuit is a "1" if the path is activated, and is "0" otherwise. In order to determine whether there is any input combination that activates a path, the monitor circuit is fed through an ATPG block 208 to find an input vector that causes the output monitor circuit to be a "1". Library table 202 contains the information required to create the AND function for each path. The information in library tables 202 for each primitive is enclosed within a begin and an end statement. Each line of the information which forms a primitive contains four fields: an on-path output signal, an on-path input signal, a netlist to be added, and the connection to be made. Path list 203 lists all of the paths that are to be identified as false or not false. Netlist 204 contains the original netlist. False path preparation block 205 modifies a netlist for false path identification. It accepts a netlist, path information, and a library table as inputs. It then modifies the netlist by adding AND function circuitry to validate each path. The output from false path preparation block 205 is an updated netlist 206 and a fault list 207. The updated netlist 206 contains the modified netlist including modifications, such as new inputs in the module definition, a new output statement for each path, and a new AND gate for each path. The inputs to the AND function are the off-path signals that are derived from the library table 202. Fault list 207 contains the outputs of all the AND gates generated by the false path preparation block 205. The resulting false paths identified are contained in block 209.

Figure 3:
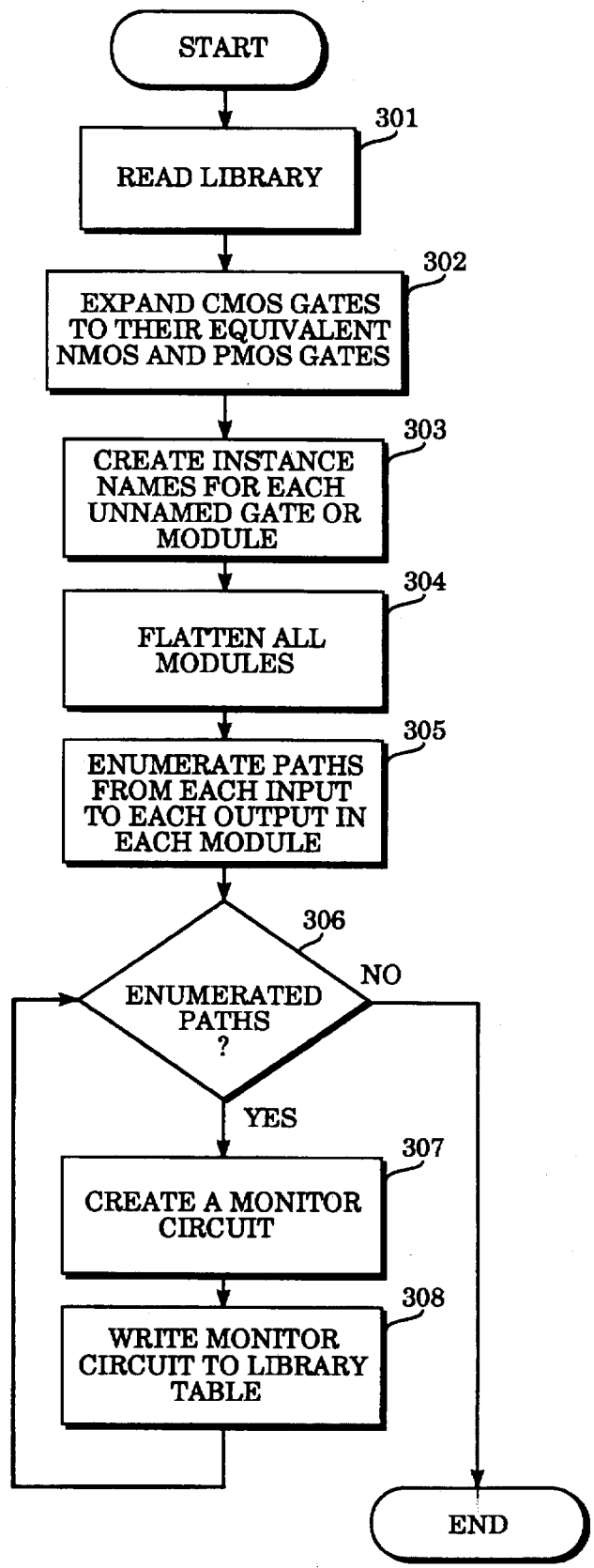
FIG. 3 shows a flowchart describing the steps for generating the library table from the primitive component library file.

FIG. 3 shows a flowchart describing the steps for generating the library table from the library file. Initially, the library is read, step 301. The comments are removed and CMOS gates are expanded to their equivalent NMOS and PMOS gates, step 302. Next, instance names are created for each un-named gate or module instance, step 303. All modules are then flattened, step 304. Note that step 304 is optional. Thereupon, the paths from each input to each output in each module is enumerated, step 305. For each path, a monitor circuit is created, step 307. This monitor circuit is then written to the library table, step 308.

For each input-output pair in a module, a monitor circuit is created. An input can have multiple paths connecting it to the output, or there may be no paths at all. In order to propagate a transition from an input of a gate to its output, the other inputs, called off-paths, must be set to certain values. For buffers and inverters, there are no other inputs. For AND and NAND gates, the other inputs must be set to 1. On the other hand, if the transition propagates from the control input to the output, all the other tristate elements connected to the same output node are examined.

To determine whether these conditions are satisfied, the off-paths are coupled into a new gate, known as the gate monitor. The gate monitor outputs a 1 if the conditions are satisfied. Otherwise, the gate monitor outputs a 0. For AND and NAND gates, the gate monitor is a buffer if there is only one off-path input. Otherwise, all of the off-path inputs are ANDed. For OR and NOR gates, the gate monitor is inverted if there is only one off-path input. Otherwise, it is the NOR of all off-path inputs.

Figure 4A:
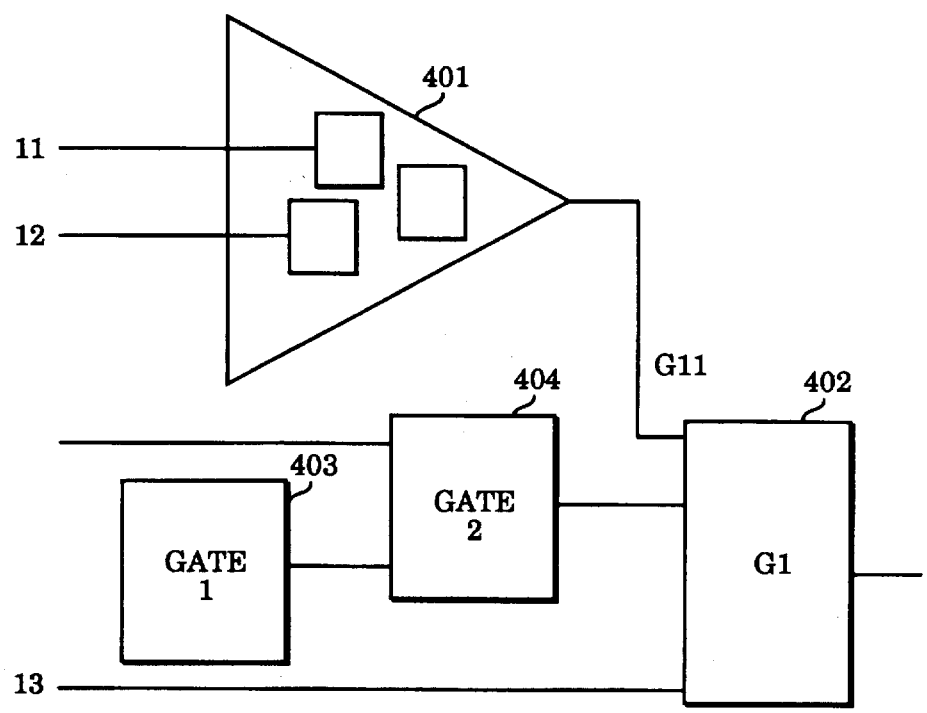
FIG. 4a shows an internal-net off-path input from cone to gate monitor.
Figure 4B:
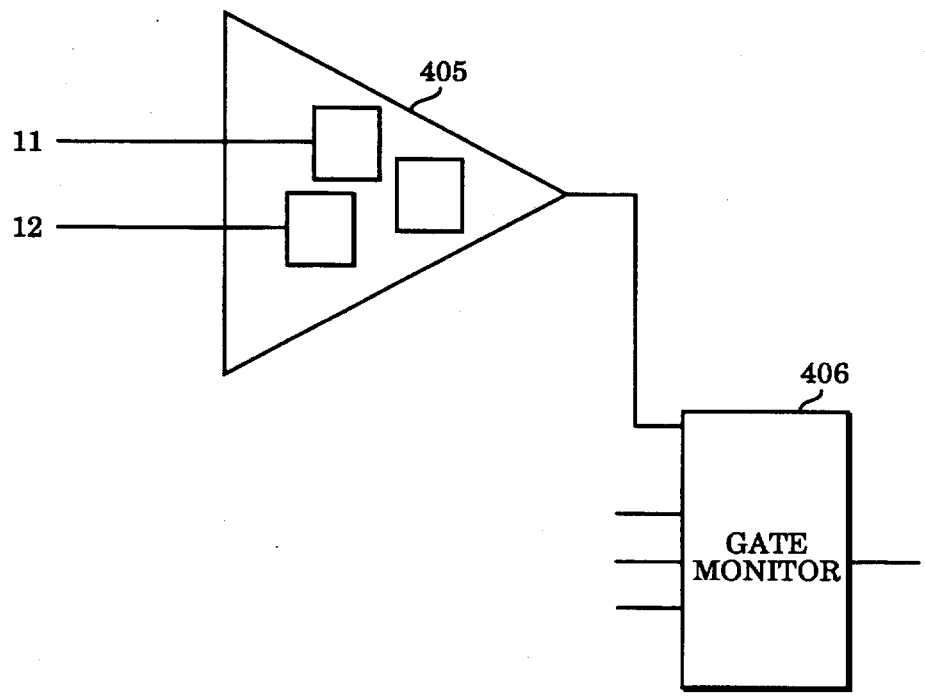
FIG. 4b shows a monitor circuit for a primitive component containing an internal off-path net.

Off-path inputs in general may not be primary inputs of the module. There is a possibility that these internal off-path inputs are not accessible from a higher level module. Therefore, the conditions on these internal nets should be extracted as a function of primary input only. The library generator extracts this information by cutting and pasting the block producing the off-path input. This cone is appended to the monitor circuit. An inverter is inserted between the cone and the monitor circuit if the required condition is a 0 on the off-path. FIG. 4a shows an internal net off-path input from block 401 to gate monitor 402. Gate monitor 402 also accepts input signals from gates 403 and 404. FIG. 4b shows a monitor circuit for gate monitor 406 having an off-path monitor 405.

Each path is a series of connected gates. In order to propagate a transition along a path, the off-path inputs of the gates in the path should have a noncontrolling value. To satisfy this condition, all the gate monitors for the gates along the path should have 1 output. This ensures that the path monitor is the AND of the outputs of those gate monitors. Under certain circumstances, there may be more than one path connecting a particular input to a particular output. If so, activating any path will ensure that a transition propagates from that input to that output. Hence, a 1 on any path monitor suffices, and the input-output monitor circuit for that input-output pair is the OR of all path monitors for the paths connecting between that input and that output.

Figure 5:
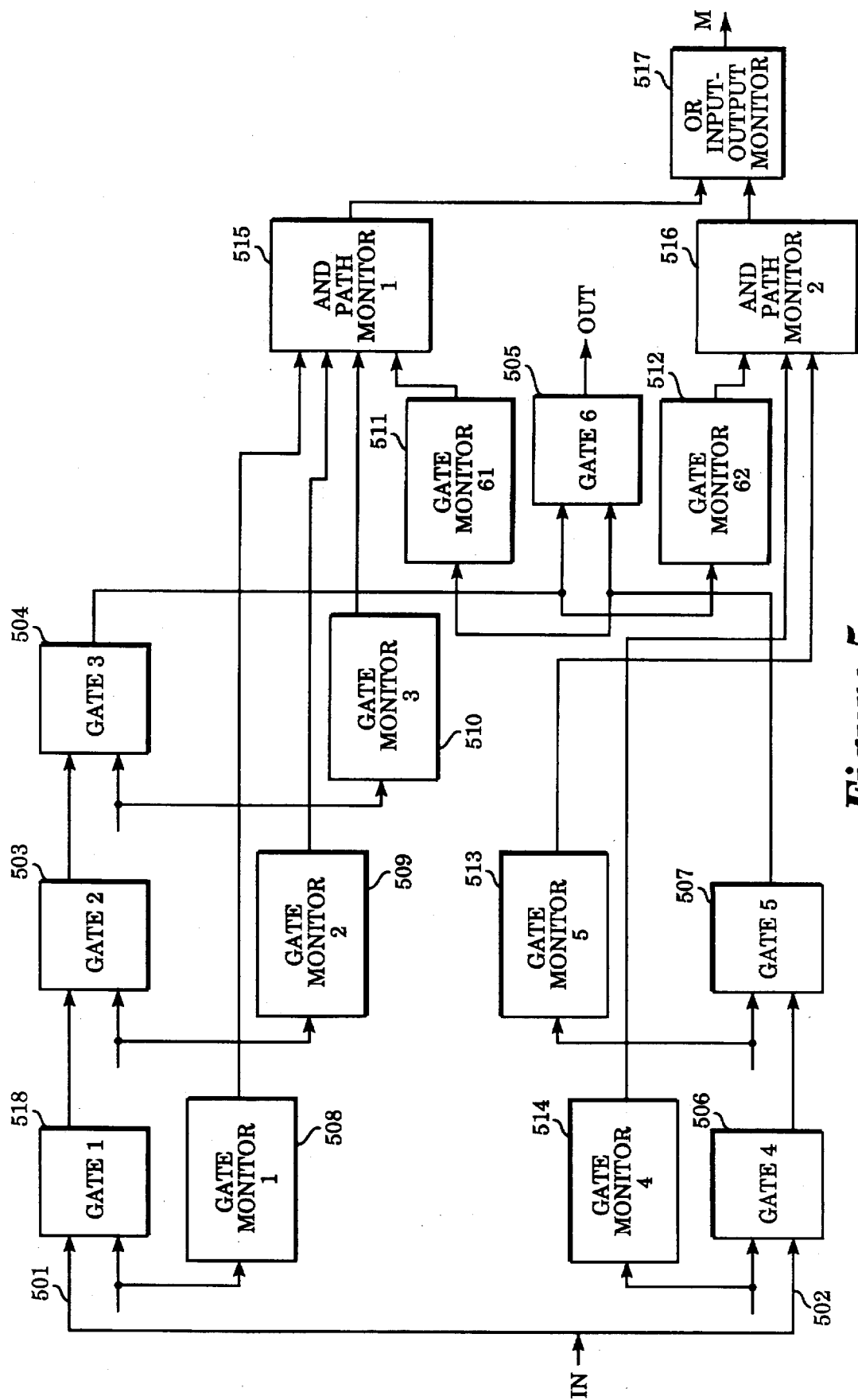
FIG. 5 shows one example of a gate monitor circuit.

FIG. 5 shows one example of a gate monitor circuit. There are two paths 501 and 502 between input and output. Path 501 includes gates 518 and 503-505, and path 502 includes gates 505-507. These paths and gates comprise the monitor circuit. The original circuit is comprised of gate monitors 508-514, path monitors 515-516, and input-output monitor 517. Note that gate monitors 511 and 512 have different inputs. Path monitor 515 and 516 are the path monitors for path 501 and path 502, respectively. The output of input-output monitor 517 is 1 if and only if a transition can propagate from the Input to the Output.

In the currently preferred embodiment, CMOS transmission gates are replaced by their equivalent PMOS and NMOS gates when the netlist is parsed. If an input to a gate in the netlist is a constant or a supply voltage, the library generator reduces the gate either by eliminating the input or by eliminating the entire gate (because of a constant output), depending on the gate type and the input constant. When an input is thusly eliminated, the type of gate may be changed (e.g., if one input to a 2-input AND gate is tied to a constant 1, this input is eliminated and the gate is changed to a buffer). When a gate is eliminated, the effect of the constant output is propagated to those gates whose inputs are connected to this output. These gates will then be further reduced because of the new constant input. These reductions are summarized in Table 2 below.

TABLE 2

Constant Input Reductions

| Gate | Input | # of Inputs | Reductions | Output |
|---|---|---|---|---|
| BUF/INV | const 0 | 1 | Eliminate Gate | 0/1 |
| BUF/INV | const 1 | 1 | Eliminate Gate | 1/0 |
| AND/NAND | const 0 | X | Eliminate Gate | 0/1 |
| AND/NAND | const 1 | 2 | Eliminate input Change gate to BUF/NOT | |
| AND/NAND | const 1 | >2 | Eliminate input | |
| OR/NOR | const 0 | 2 | Eliminate input Change gate to BUF/NOT | |
| OR/NOR | const 0 | >2 | Eliminate gate | |
| OR/NOR | const 1 | X | Eliminate input | 1/0 |
| XOR/XNOR | const 0(1) | 2 | Eliminate input Change gate to BUF(NOT)/NOT(BUF) | |
| XOR/XNOR | X | >2 | Eliminate input | |
| BUFIF0(PMOS)/ NOTIF0 | 0 control | 2 | Eliminate control Change gate to BUF/NOT | |
| BUFIF0(PMOS)/ NOTIF0 | 1 control | 2 | Eliminate gate WARNING MSG | |
| BUFIF1(NMOS)/ NOTIF1 | 0 control | 2 | Eliminate gate WARNING MSG | |
| BUFIF1(NMOS)/ NOTIF1 | 1 control | 2 | Eliminate control Change gate to BUF/NOT | |
| Any tristate element | 0/1 data | 2 | WARNING MSG | |

Note that if the data input of a tristate element is constant, the output is either a constant logic value or a high impedance. For example, if the data input of a NOTIF0 gate is 1, then the output is 0 when control is 0, and the output is high impedance when the control is 1. The output can not be a 1. If this tristate element shares the same output node with other tristate elements in the circuit, this tristate element can be reduced. However, if the output of the tristate element is not shared, the library generator sets the output of the tristate to be either the control input or its complement.

If the control input of a tristate element is on the path then that tristate element cannot guarantee a transition during the output period. The reason is that a transition on the control of the tristate element will cause the tristate to turn from "off" to "on" states or vice versa, where the "off" state is a high impedance. The "on" state is either the data input or its complement. If the output of the tristate element is shared with other tristate elements and if exactly one tristate is "on" at any time, then it is assured that this output is not in a high impedance state.

Figure 6B:
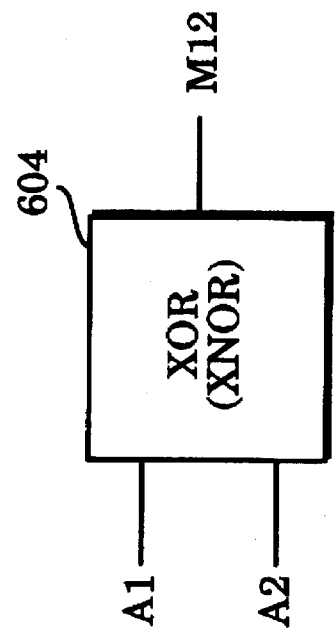
FIG. 6b shows a monitor circuit as may be employed for tristate elements.
Figure 6A:
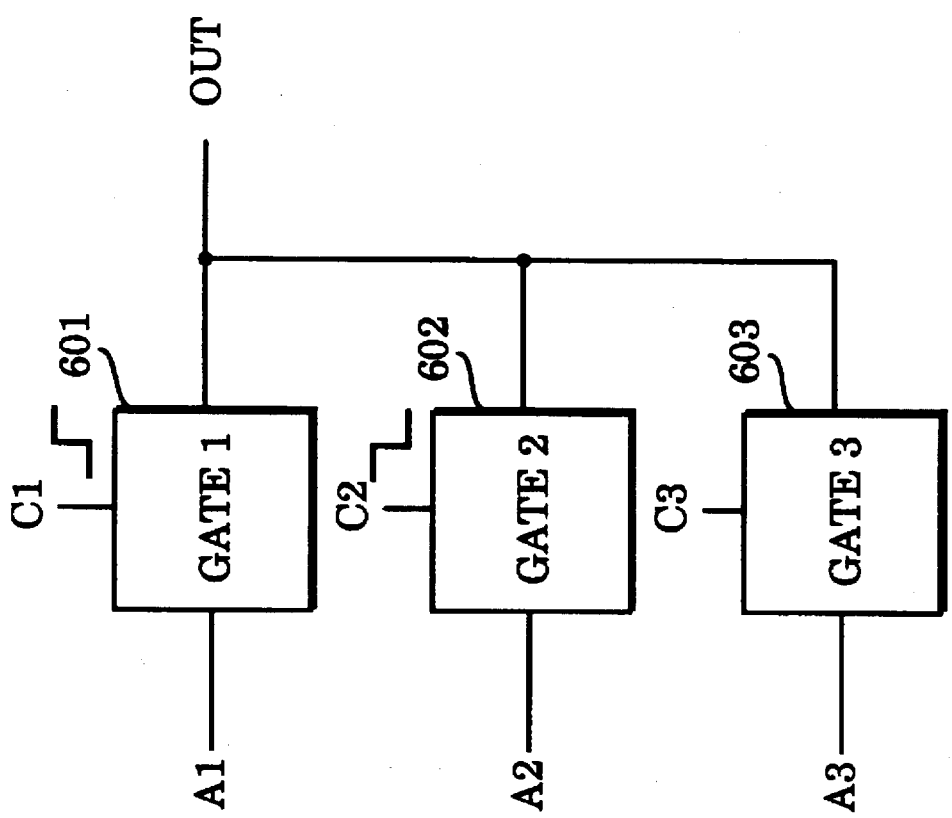
FIG. 6a shows on-path tristate elements.
Figure 6D:
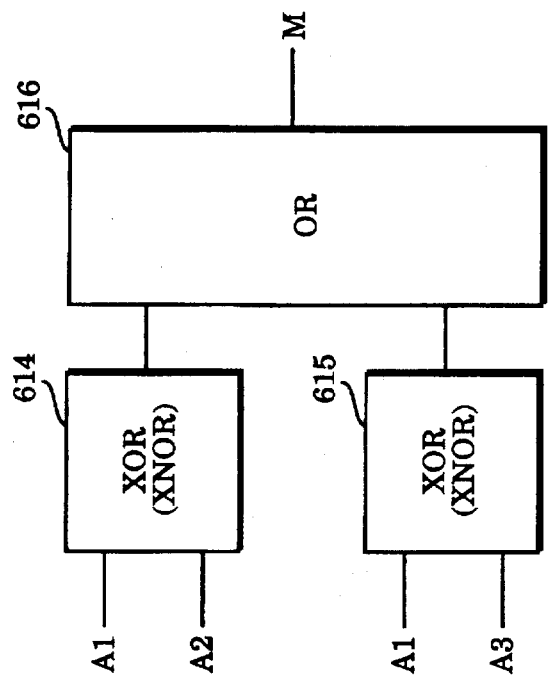
FIG. 6d shows the currently preferred embodiment of a monitor circuit as generated by the library generator.
Figure 6C:
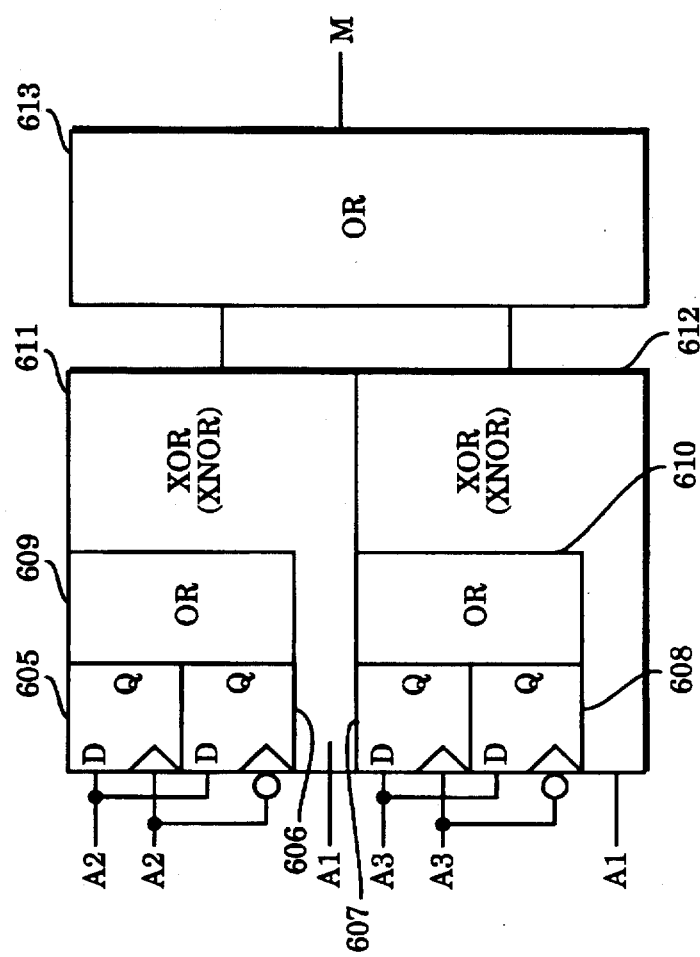
FIG. 6c shows an alternative embodiment of a monitor circuit for use with tristate elements.

FIG. 6a shows on-path tristate elements. Tristate elements 602 and 603 share the same output with tristate element 601. If the transition through the control of element 602 turns from "off" to "on," then to ensure that a transition occurs on the output, the output of element 601 should be the complement of the output of element 602. This is true if and only if the XOR of the two outputs is equal to 1. In terms of inputs, if both elements 601 and 602 are inverting or if both are non-inverting, the XOR of the outputs is equivalent to the XOR of the inputs. If one tristate element is inverting while the other is not inverting, the XOR of the outputs is equivalent to the XNOR of the inputs. FIG. 6b shows a monitor circuit as may be employed for tristate elements. The monitor circuit is comprised of an XOR/XNOR gate 604. FIG. 6c shows an alternative embodiment of a monitor circuit for use with tristate elements. Assuming that element 603 switches instead of element 602, there is no way to detect whether elements 602 or 603 switches by relying on purely combinational circuits because memory is needed to detect a transition. Consequently, edge triggered flip-flops 605–608 are used to capture either positive or negative transitions on the control element. It is assumed that the data inputs a–a3 are stable during this transition. Flip-flops 605–608 are initialized to be equal to a1 before the transition. The outputs of flip-flop 605–606 are ORed together by OR gate 609. An XOR operation is then performed with a1 by XOR gate 611. Similarly, the outputs of flip-flops 607–608 are ORed together by OR gate 610. An XOR Operation is then performed by XOR gate 612 on a1. The outputs of XOR gates 611–612 are ORed together by OR gate 613. FIG. 6d shows the currently preferred embodiment of a monitor circuit as generated by the library generator. In order to simplify the monitor circuit, sequential elements are not used. It is assumed that the transitions on the control elements are present as shown. For example, a1 and a2 are input to XOR gate 614 while a1 and a3 are input to XOR gate 615. The outputs of XOR gate 614 and 615 are then ORed together by OR gate 616.

The off-path dependence on an on-path input is now described. An off-path input signal s that is an internal net may be replaced by a function of primary inputs. These primary inputs may include the on-path input. This means that there exists another path where signal s is on the path. Hence, when building the path monitor circuit for the first path, all nets in the off-path monitor circuit which are actually on-path can be dropped because they will be factored in when the path monitor circuit for the second path is created.

Figure 7A:
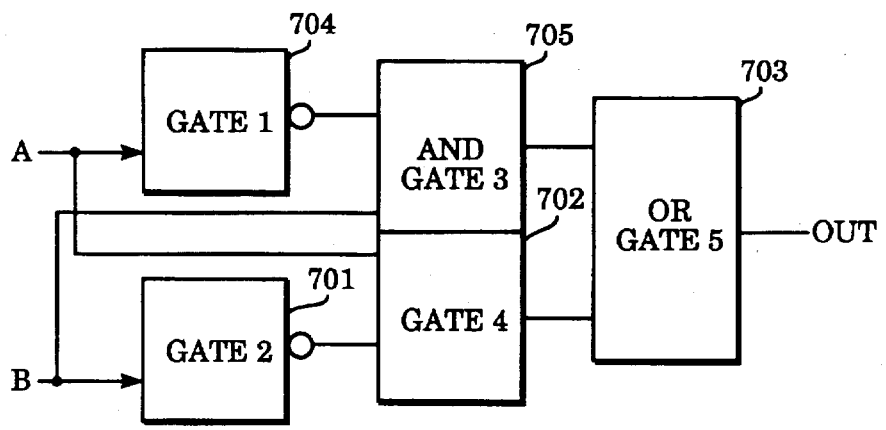
FIG. 7a shows an AND-OR implementation of an exclusive-or (XOR) gate.
Figure 7B:
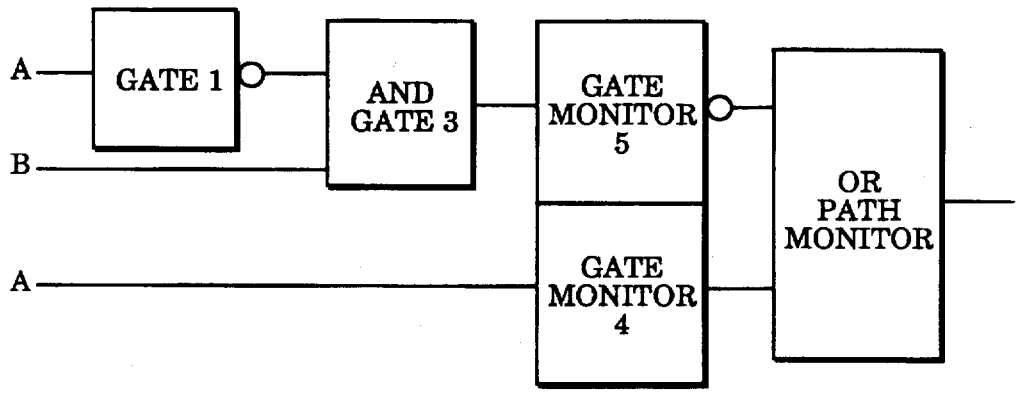
FIG. 7b shows the path monitor circuit for the B signal propagating through gates.
Figure 7C:
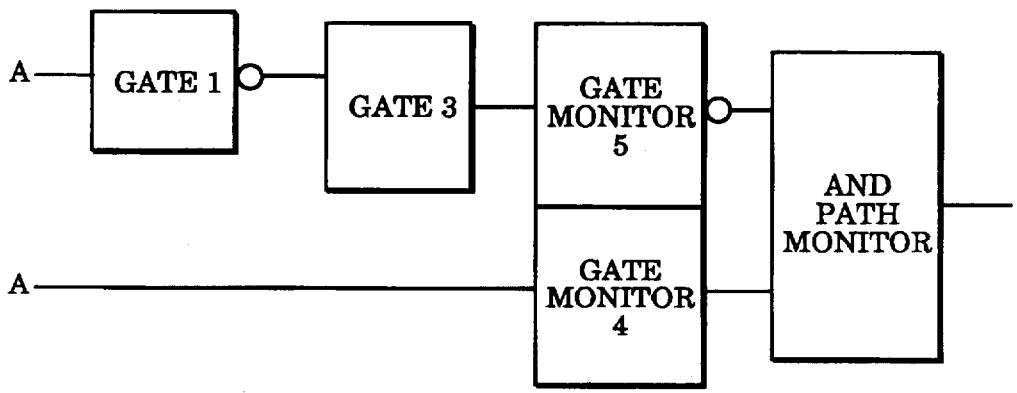
FIG. 7c shows the elimination of an on-path input for an XOR gate.
Figure 7D:
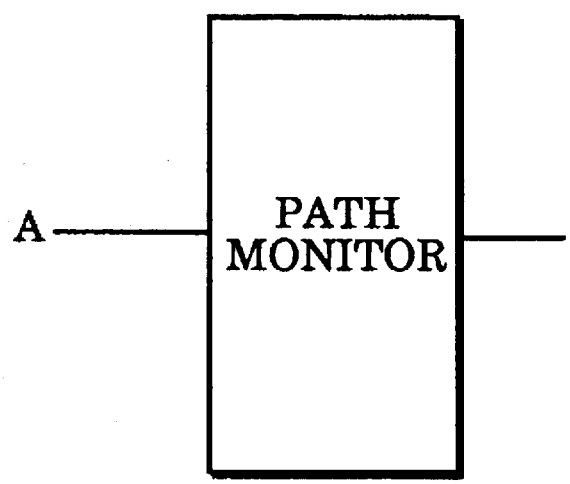
FIG. 7d shows the reduction of the path monitor circuit resulting in a single buffer.

FIG. 7a shows an AND OR implementation of an XOR gate. Gates 701–703 are the original circuit, whereas gates 704–705 comprise the monitor circuit. FIG. 7b shows the path monitor circuit for the b signal path propagating through gates 701–703. It can be seen that the off-path monitor circuit is dependent on the on-path input b. Thus, this input can be dropped and the AND gate is converted into a buffer as shown in FIG. 7b. Further reduction of this circuit results in a single buffer, as shown in FIGS. 7c and 7d. Similarly, the reduced path monitor circuit or the b signal path propagating through gate 705 and 703 is comprised of a single inverter 701. Therefore, the input-output monitor for input signal b and output Out is a+a'=1. This means that the transition can propagate from input b to Out, regardless of the state of signal a.

Figure 8:
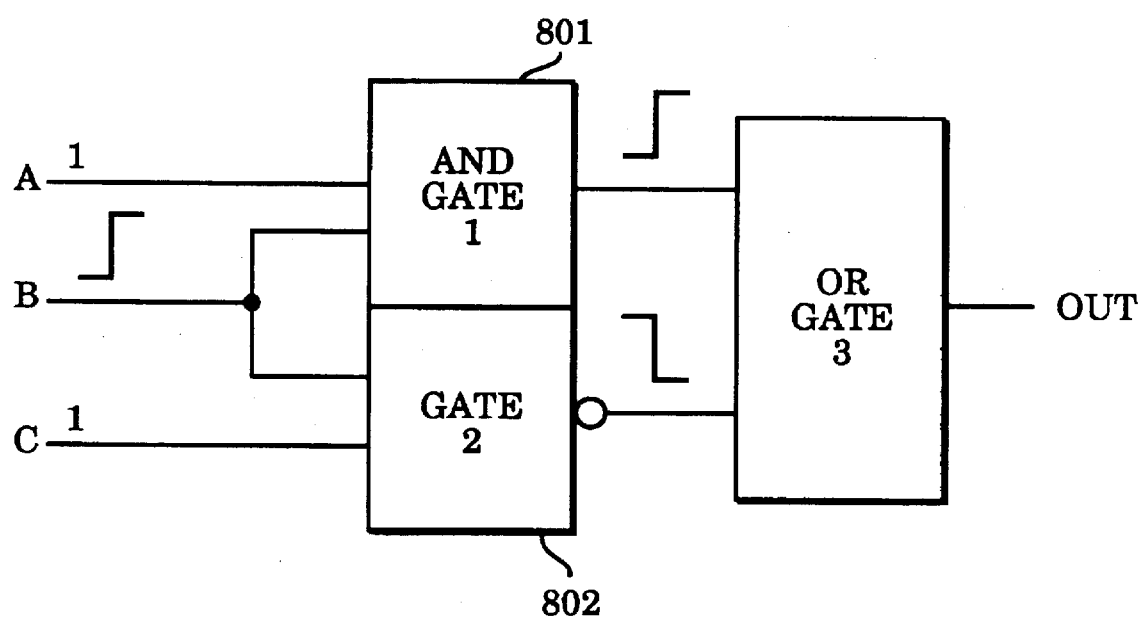
FIG. 8 shows a circuit having two paths to the output.
Figure 9:
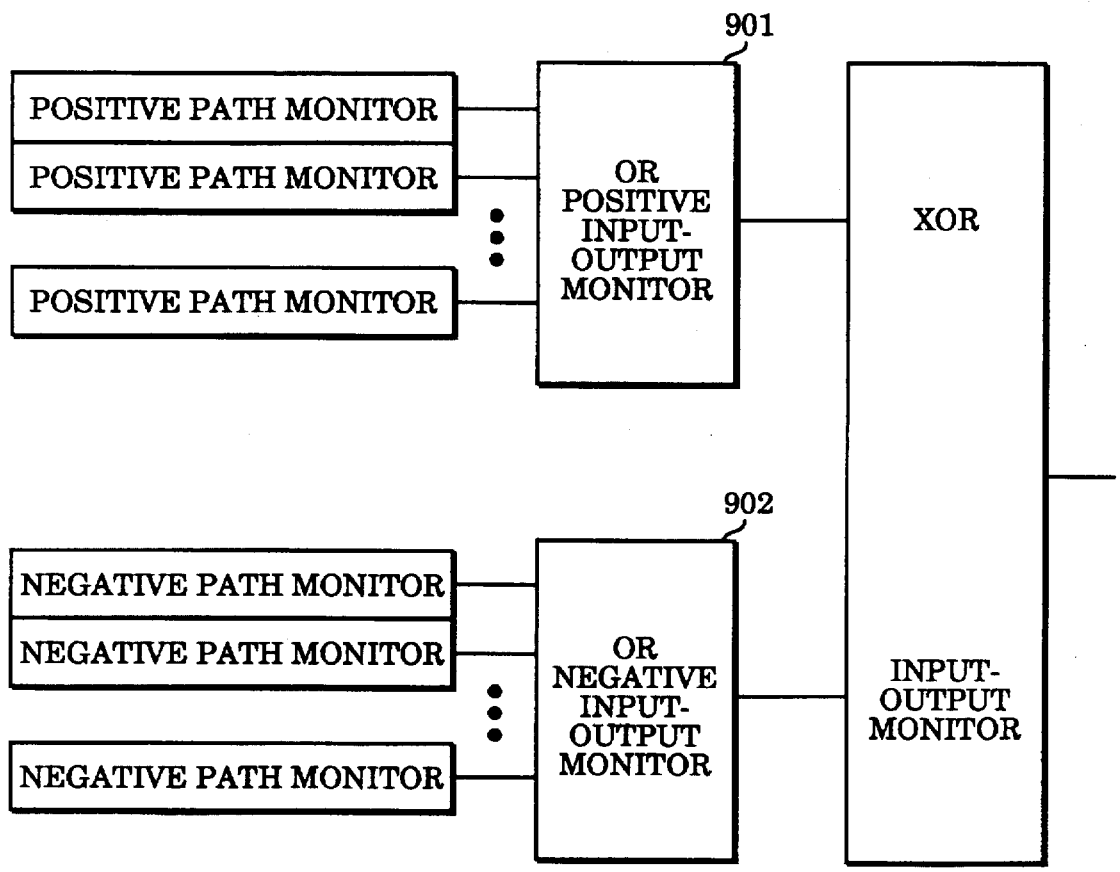
FIG. 9 shows an input-output monitor with transition polarity consideration.

If there is more than one path from an input a to an output Out and at least one path inverts the transition while the other does not, there is a possibility that these two paths are activated at the same time. If so, these two paths may cancel each other out or cause a static hazard. FIG. 8 shows a circuit having two paths to the output. It can be seen that the input b has two paths to the output Out: one through gate 801 and the other through gate 802. If both a and c are 1, and a positive transition is applied to b, the output will either be a static 1 or there could be a static hazard, depending on the relative timing of the gates. Since the library generator assumes that the transition is propagated through if at least one or more paths is activated, it might falsely consider this cancellation case as a valid activation condition. To prevent this condition, complementing and non-complementing paths should be separated. The input-output monitor circuit is then the XOR of the complementing path monitor circuit, and the non-complementing path monitor circuit. This is done to prevent complementing and non-complementing paths to be activated at the same time. FIG. 9 shows an input-output monitor with transition polarity consideration. The positive input-output monitor 901 collects all the positive (non-complemented) transitions, while the negative input-output monitor 902 collects all negative (complemented) transitions. Undeterministic polarity paths should be included in both the positive input-output monitor 901 and the negative input-output monitor 902.

Figure 10:
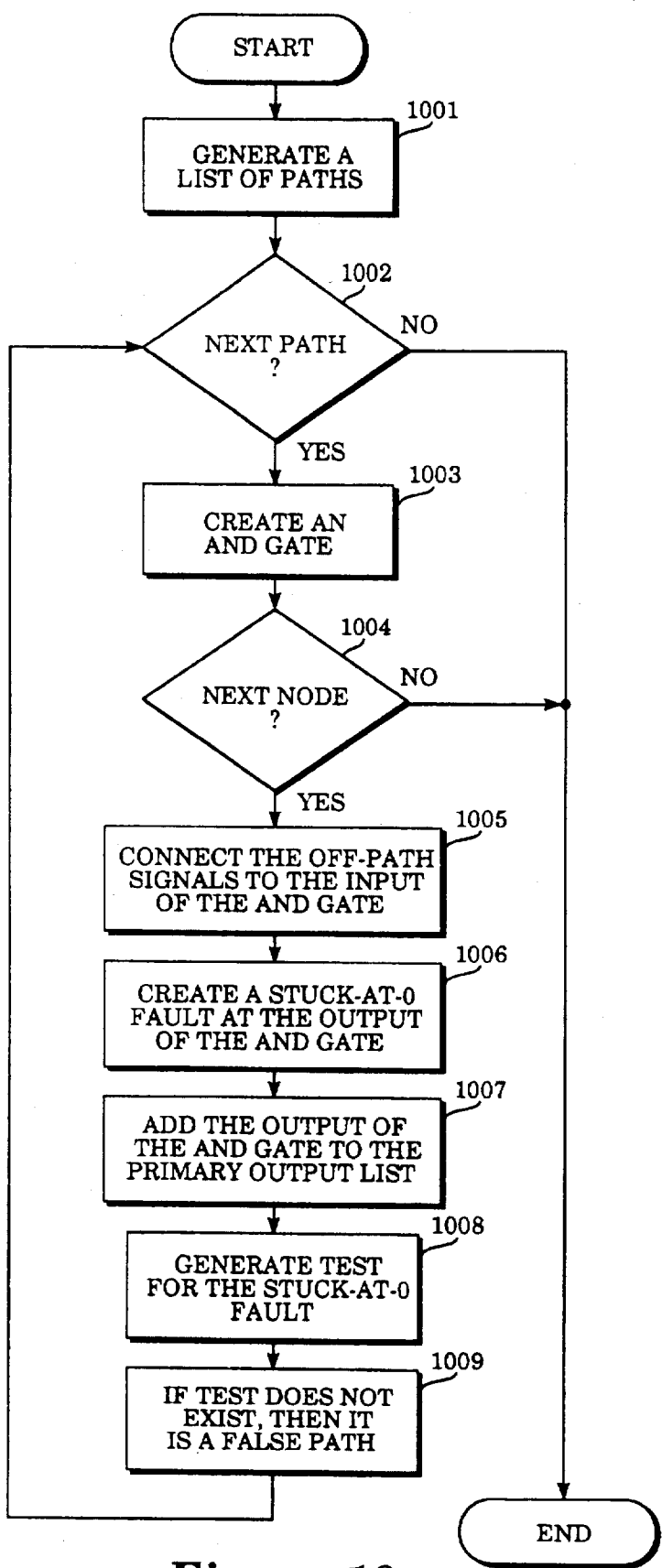
FIG. 10 shows a flowchart describing the steps for identifying the paths that are not excitable which were found to exceed the timing constraints.

FIG. 10 shows a flowchart describing the steps for identifying the paths that are not excitable which were found to exceed the timing constraints. In step 1001, a list of paths is generated. For each path, steps 1003–1009 are performed. In step 1003, an AND gate is created. For each node of the path, steps 1005–1009 are performed. In step 1005, the off-path signals are connected to the input of the AND gate. Next, a stuck-at-zero fault is created to the input of the AND gate, step 1006. The output of the AND gate is added to the primary output list, step 1007. A test is generated for the stuck-at-zero fault, step 1008. If the test does not exist, it is a false path. Otherwise it is a true path, step 1009.

Figure 11:
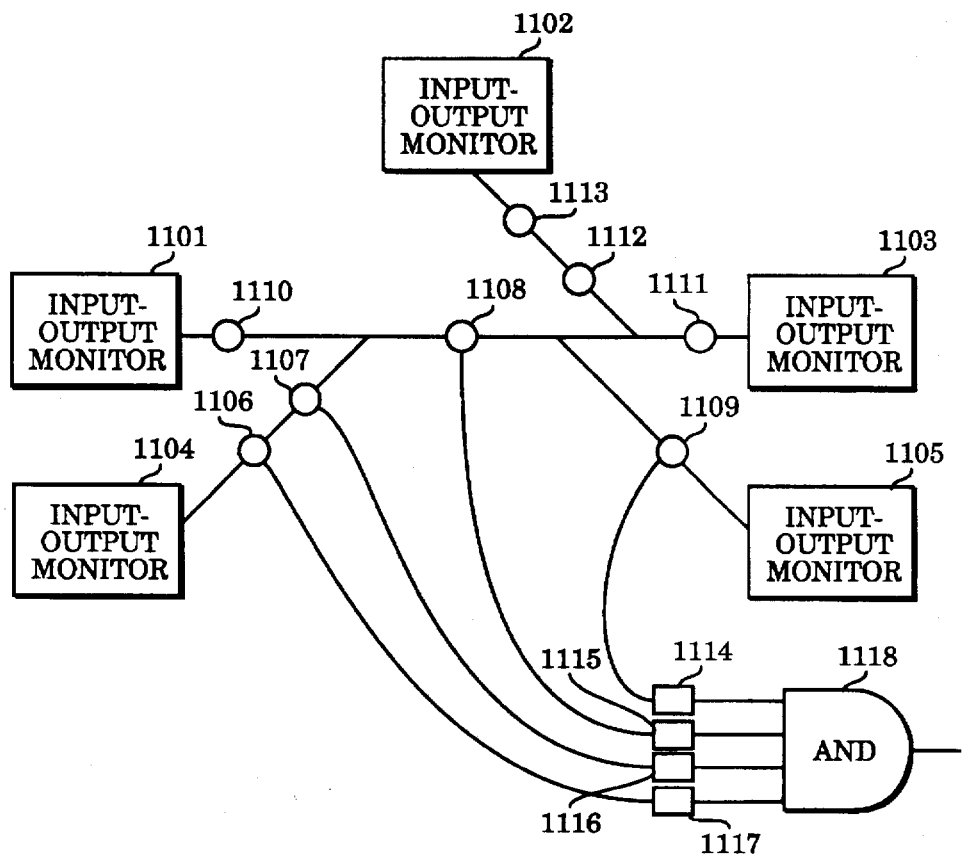
FIG. 11 shows a block diagram representative of a portion of an integrated circuit and a corresponding false path identification circuit.

FIG. 11 shows a block diagram representative of a portion of an integrated circuit and a corresponding false path identification circuit. Given five I/O points 1101–1105, there may be numerous paths which interconnect these I/O points. Within each path there may be numerous elements, such as elements 1108–1113. For example, the path extending from I/O 1101 to I/O 1103 includes elements 1108, 1110, and 1111. The path from I/O 1104 to I/O 1105 includes elements 1106–1109. It can be seen that these two paths share element 1108. For each element, a gate monitor circuit is added to determine whether that path is a false timing path. For example the path from I/O 1104 to I/O 1105 includes four gate monitor circuits 1114–1117 corresponding to the five elements 1106–1109 in that path. The outputs from the gate monitor circuits 1114–1117 are fed into AND gate 1118. If it is possible to output a 1 from AND gate 1118, then that path is designated as being a true path. If, however, a 1 cannot be output from AND gate 1118 after a predetermined amount of time, that path is designated as being a false path.

Figure 12:
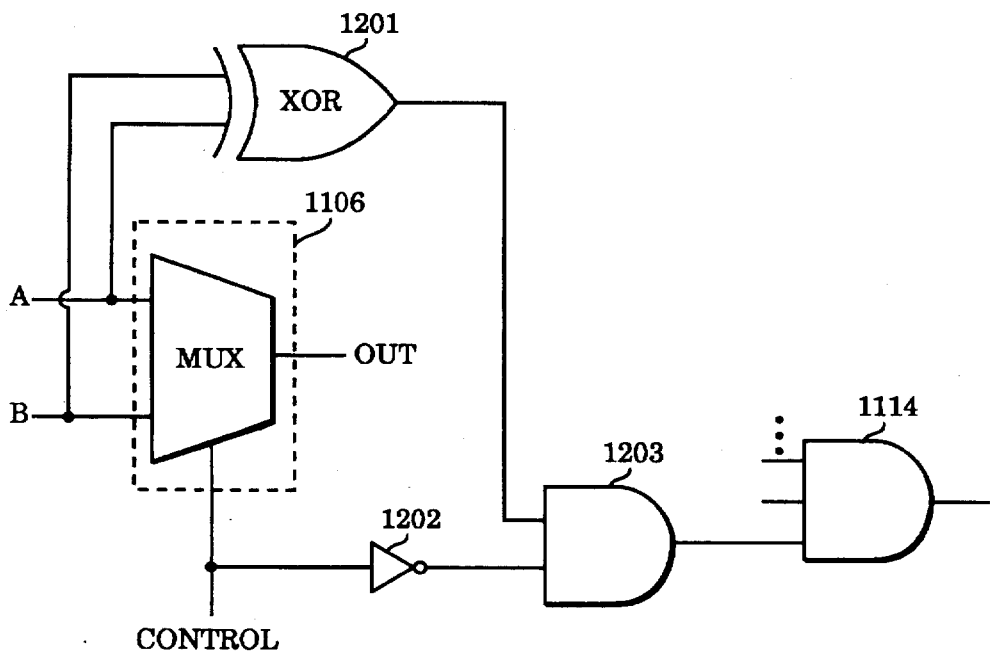
FIG. 12 shows a typical monitor circuit as may be employed for elements in a path.

FIG. 12 shows a gate monitor circuit as may be employed for elements in a path. Given that element 1106 is a multiplexor, the gate monitor circuit is comprised of an XOR gate 1201, and inverter 1202, and an AND gate 1203. XOR gate 1201 is coupled to the inputs a and b of the multiplexor 1106. Inverter 1202 is coupled to the control signal to multiplexor 1106. The outputs of XOR 1201 and inverter 1202 are coupled to the inputs of AND gate 1203. Hence, AND gate 1203 outputs a 1 only if the inputs to multiplexor 1106 are 0 1, or 1 0 and the control signal to multiplexor 1106 is a 0. If these conditions are not met, and gate 1203 will not output a 1. As a result, AND gate 1114 will not output a 1. This would signify that the path from I/O 1104 to I/O 1105 is a false path.

Thus, an apparatus and method for identifying false timing paths in digital circuits is disclosed.

What is claimed is:

1. A computer-aided design method for identifying false signal paths in a simulated digital circuit wherein at least one simulated path element lying along a signal path is associated with at least one off-path signal, said method comprising the steps of:

a) creating a simulated gate monitor circuit for monitoring the path element in the signal path, the gate monitor circuit having at least one input for receiving an off-path signal from the path element, and producing a predetermined output logic value in response to the at least one input whenever a signal transition propagates through the path element;

b) creating a simulated path monitor circuit corresponding to the signal path, the path monitor circuit having at least one input coupled to at least one gate monitor circuit for a path element in the signal path, and producing a predetermined output logic value in response to the at least one input whenever a signal transition propagates through the signal path;

c) identifying the signal path as a false path if the path monitor circuit does not produce the predetermined output logic value within a predetermined period of time after stimulating the digital circuit with a set of test signals;

d) repeating step c) for a plurality of sets of test signals; and e) repeating steps a)–d) for a plurality of signal paths through the digital circuit.

2. The method of claim 1 further comprising the step of generating a list of false signal paths in the digital circuit.

3. The method of claim 1 wherein the path monitor circuit comprises a multiple input AND gate.

4. The method of claim 3 further comprising the step of replacing a CMOS circuit element with an equivalent combination of PMOS and NMOS elements before stimulating the digital circuit with the set of test signals.

5. The method of claim 1 further comprising the step of Simplifying a simulated circuit element having a logic input at a constant supply voltage before stimulating the digital circuit with the test signals.

6. The method of claim 5 wherein the circuit element is a two-input AND gate having a logical "1" at one input, the AND gate being replaced with an interconnect.

7. The method of claim 1 wherein the signal path goes through a control input of a simulated tri-state element, the tristate element having an output shared with at least one other tristate element.

8. The method of claim 1 further comprising the steps of:

separating complementing and non-complementing paths; and performing an XOR operation on an output of a complementing path monitor circuit and an output of a non-complementing path monitor circuit.

9. A computer system for identifying false timing paths of a simulated digital circuit, the computer system comprising:

a memory for storing a plurality of simulated circuit elements, interconnections between the circuit elements, and functions of the circuit elements, the circuit elements and interconnections defining at least one signal path in the simulated digital circuit; and a processor coupled to the memory and executing a computer program for creating a plurality of simulated monitor circuits coupled to the simulated digital circuit, .the monitor circuits associated with signal paths, the processor further executing a computer program for creating a simulated test signal generator for generating a plurality of test signals that are applied as inputs to the simulated digital circuit, and a simulated testing unit for generating a false timing path signal to identify a signal path having a simulated monitor circuit that does not produce a predetermined logic value within a predetermined period of time after the test signals have been applied to the simulated digital circuit.

* * * * *